United States Patent [19]

Fujii et al.

[11] Patent Number: 4,700,089
[45] Date of Patent: Oct. 13, 1987

[54] DELAY CIRCUIT FOR GATE-ARRAY LSI

[75] Inventors: Shigeru Fujii; Masanori Oozeki, both of Yokohama, Japan

[73] Assignee: Fujitsu Limited, Kanagawa, Japan

[21] Appl. No.: 767,574

[22] Filed: Aug. 20, 1985

[30] Foreign Application Priority Data

Aug. 23, 1984 [JP] Japan .................................. 59-174004
Aug. 23, 1984 [JP] Japan .................................. 59-174005
Aug. 24, 1984 [JP] Japan .................................. 59-175063

[51] Int. Cl.$^4$ ................. H03K 19/094; H03K 17/284; H03K 17/687; H03K 3/353
[52] U.S. Cl. ..................................... 307/605; 307/451; 307/585; 307/594; 307/603; 307/279
[58] Field of Search ............... 307/590, 594, 601, 603, 307/605, 606, 279, 585, 576, 579, 450, 451, 270, 290

[56] References Cited

U.S. PATENT DOCUMENTS

| 4,395,774 | 7/1983 | Rapp ............................... 307/576 X |
| 4,464,587 | 8/1984 | Suzuki et al. ................... 307/451 X |
| 4,476,401 | 10/1984 | Lin .................................. 307/605 X |
| 4,490,629 | 12/1984 | Barlow et al. ................... 307/585 X |
| 4,518,873 | 5/1985 | Suzuki et al. ................... 307/594 X |
| 4,532,439 | 7/1985 | Koike .............................. 307/451 X |
| 4,539,489 | 9/1985 | Vaughn ............................ 307/290 |
| 4,563,594 | 1/1986 | Koyama .......................... 307/603 X |
| 4,571,504 | 2/1986 | Iwamoto et al. ................ 307/579 X |

Primary Examiner—Stanley D. Miller
Assistant Examiner—David R. Bertelson
Attorney, Agent, or Firm—Armstrong, Nikaido, Marmelstein & Kubovcik

[57] ABSTRACT

A delay circuit for a gate-array LSI including at least one inverter having a plurality of P-channel transistors ($Q_{1p}$ to $Q_{4p}$) and a plurality of N-channel transistors ($Q_{1n}$ to $Q_{4n}$) connected in series. The P-channel/N-channel transistors are driven by an input potential (IN), and the common output of the innermost pair of P-channel/N-channel transistors generates an output.

6 Claims, 36 Drawing Figures

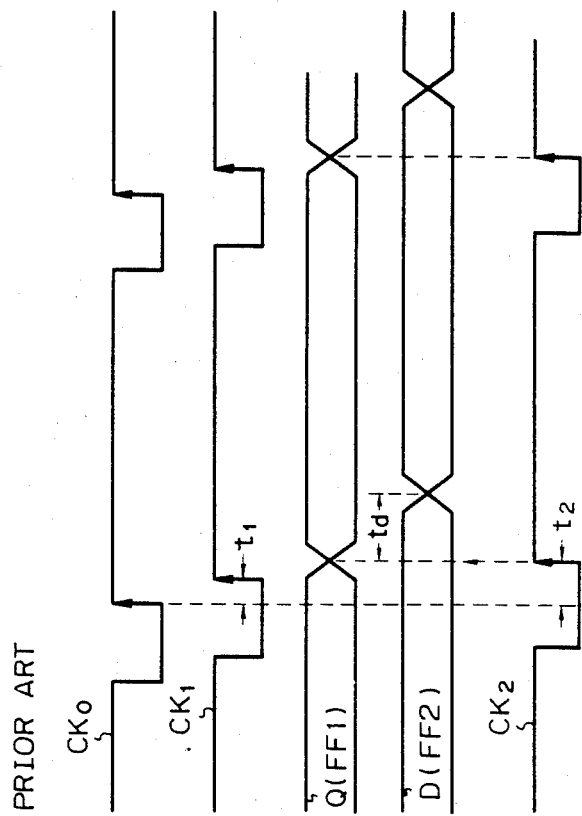

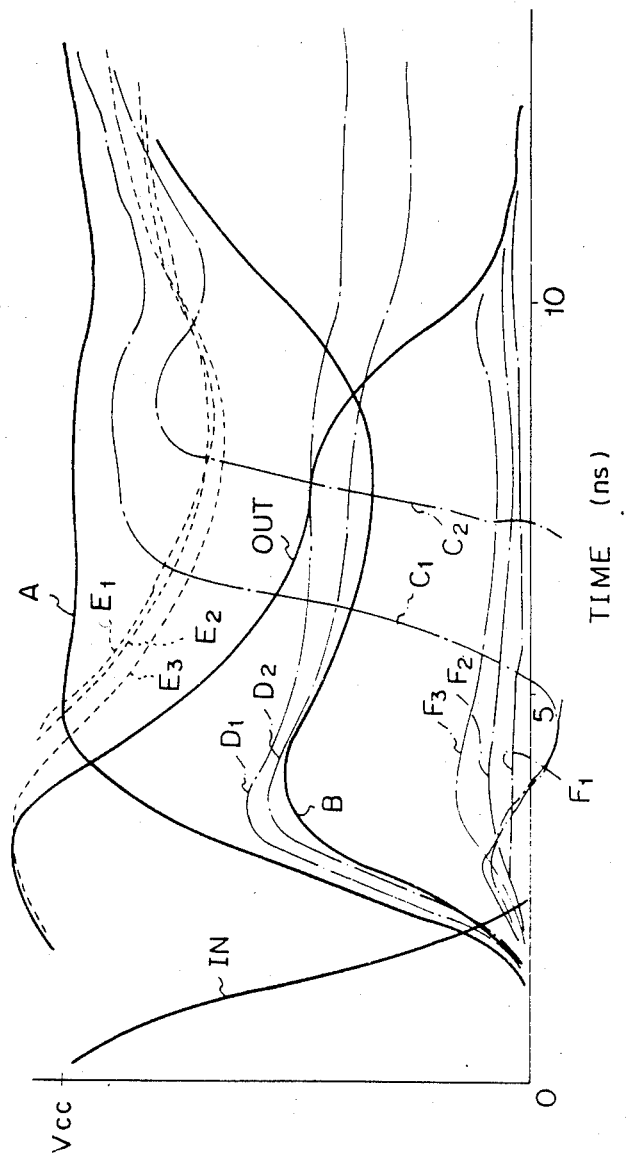

DELAY CIRCUIT FOR GATE-ARRAY LSI

BACKGROUND OF THE INVENTION

1. Field of the Invention

The present invention relates to a delay circuit applied to, for example, a gate-array large-scale integrated circuit (LSI).

2. Description of the Related Art

In a gate-array LSI, a delay circuit is used for delaying the propagation of a signal for a definite time period. Such a delay circuit must offer an optimum delay time period, a small mounting area, and minimum fluctuation of the delay time period.

In general, a delay time period $t_{pd}$ of one gate of a metal-insulator-semiconductor (MIS) transistor can be represented by $$t_{pd} \alpha C/g_m$$

where C is a load, capacitance, and $g_m$ is the conductance of the transistor. Further, if the load capacitance is definite, $$g_m \alpha W/L$$

where W and L are the width and length, respectively, of a gate of the transistor. Therefore, it is possible to increase the delay time period by using an inverter of MIS transistors having a small gate width W and a large gate length L. However, in a gate-array LSI, since only transistors having a definite size are used, it is impossible to arbitrarily change the size of the transistors. In other words, in a gate-array LSI, it is impossible to decrease the gate width W and increase the gate length L only for special transistors.

There is a prior art delay circuit of a gate-array LSI comprised of a series of inverters of MIS transistors having a definite size. However, when a series of such inverters are simply connected to obtain a delay time period, the larger the delay time period, the greater the number of transistors, and thus the larger the area occupied.

Note that it is also possible to construct a delay circuit by using a resistance-capacitance (RC) circuit. In this case, the delay time period must be adjusted by the resistance of polycrystalline silicon or the resistance of a diffusion region. However, such an adjustment is also impossible in a gate-array LSI. Accordingly, it is impossible to use an RC circuit as a delay circuit for a gate-array LSI.

SUMMARY OF THE INVENTION

It is an object of the present invention to provide a delay circuit, suitable for a gate-array LSI, having a small area.

According to the present invention, the delay circuit includes at least one inverter having a plurality of P-channel transistors and a plurality of N-channel transistors connected in series. In this case, the P-channel transistors are sequentially turned on from the outside to the inside by the fall of an input potential, while the P-channel transistors are sequentially turned off from the inside to the outside by the rise of the input potential. Similarly, the N-channel transistors are sequentially turned on from the outside to the inside by the rise of the input potential, while the N-channel transistors are sequentially turned off from the inside to the outside by the fall of the input potential.

Also in the present invention, two inverters having series-connected P-channel/N-channel transistors are provided. In this case, the output of each inverter is charged by the series-connected P-channel transistors thereof to increase the potential of this output, while the output of each inverter is discharged by the series connected N-channel transistors thereof to decrease the potential of this output. Therefore, the delay time period is increased by the P-channel/N-channel transistors in series.

Further, in the present invention, two inverters having series-connected P-channel/N-channel transistors, in which the outputs of the post-stage inverter are fed back to some of the inputs of the pre-stage inverters, are provided. In this case, since the outputs of the post-stage inverter are fed back to the pre-stage inverter, the driving ability thereof is reduced, thereby increasing the delay time period. Also, a large fan-out is obtained.

BRIEF DESCRIPTION OF THE DRAWINGS

The present invention will be more clearly understood from the description as set forth below, with reference to the accompanying drawings, wherein:

FIGS. 4A, 4B, 4C, 4D, and 4E are timing diagrams showing the operation of the circuit of FIG. 3;

FIGS. 27 and 28 are circuit diagrams for explaining the operation of FIG. 26.

DESCRIPTION OF THE PREFERRED EMBODIMENTS

Figure 1:
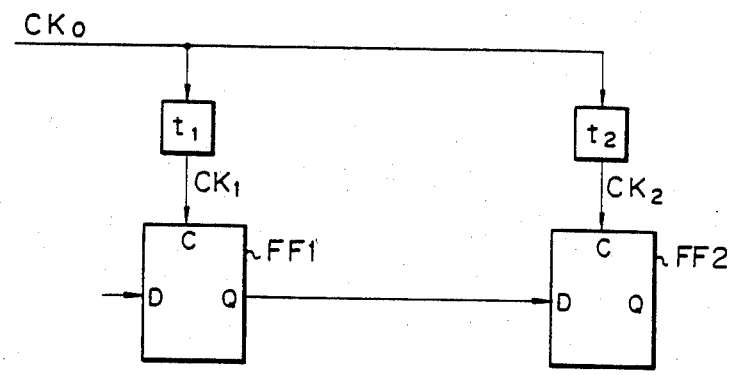
FIG. 1 is a partial circuit diagram of a gate-array LSI having no delay circuit.
Figures 2A, 2B, 2C, 2D:
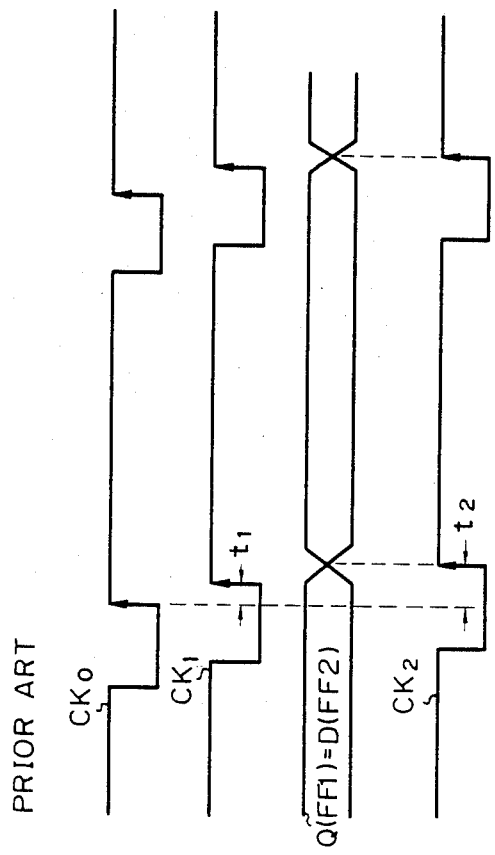
FIGS. 2A, 2B, 2C, and 2D are timing diagrams showing the operation of the circuit of FIG. 1.

In FIG. 1, which is a partial circuit diagram of a gate-array LSI, it is assumed that a clock signal $CK_0$ is delayed by time periods $t_1$ and $t_2$ to generate clock signals $CK_1$ and $CK_2$, as shown in FIGS. 2A, 2B, and 2D, thereby latching flip-flops FF1 and FF2. In this case, after the flip-flop FF1 is latched by the clock signal $CK_1$ as shown in FIG. 2C, if the delay time period $t_2$ of the clock signal $CK_2$ is large, a latch operation for the flip-flop FF2 by the clock signal $CK_2$ may be performed upon the next data. This means that the hold time period of the input data of the flip-flop FF2 by the clock signal $CK_2$ may be reduced.

Figure 3:
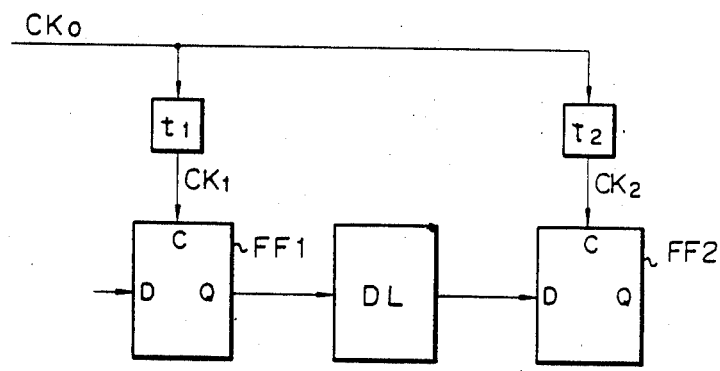
FIG. 3 is a partial circuit diagram of a gate-array LSI having a delay circuit.

In order to secure a sufficient hold time period, a delay circuit DL is interposed between the flip-flops $FF_1$ and $FF_2$, as illustrated in FIG. 3. As a result, the data output Q of the flip-flop FF1 is delayed by a time period $t_d$. Thus, the data input D of the flip-flop FF2 is delayed by the time period $t_d$ as compared with the data output Q of the flip-flop FF1, as shown in FIGS. 4C and 4D, and the hold time period of the flip-flop FF2 by the clock signal $CK_2$ becomes sufficiently large.

Figure 5:
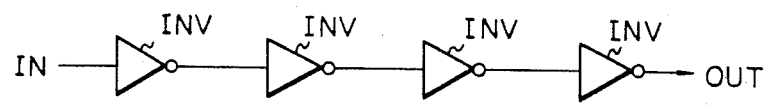
FIG. 5 is a circuit diagram of a prior art delay circuit.

FIG. 5 shows a prior art delay circuit used in a gate-array LSI. A series of inverters INV are provided. Each of the inverters INV is constructed by a basic cell, which consists, for example, of four two-input gates.

An example of a basic cell will now be explained with reference to FIGS. 6, 7, 8, and 9.

Figure 6:
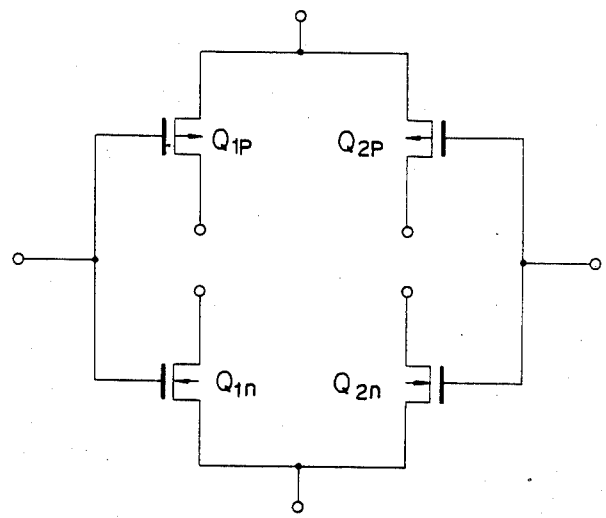
FIG. 6 is an equivalent circuit diagram of an example of one basic cell used in a complementary MIS gate array LSI.
Figure 7:
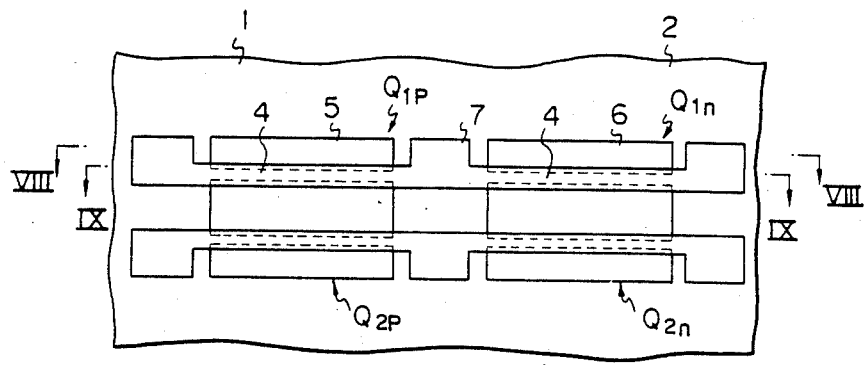
FIG. 7 is a plan view of the basic cell of FIG. 6.
Figure 8:
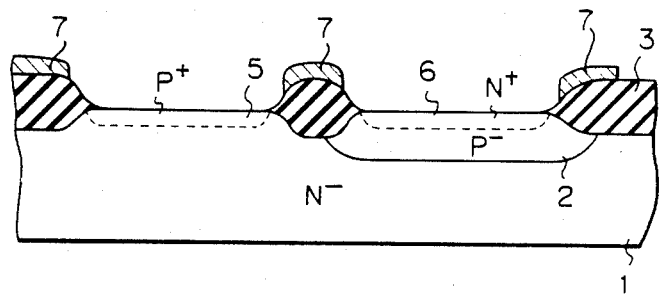
FIGS. 8 and 9 are cross-sectional views taken along the lines VIII—VIII and IX—IX, respectively, of FIG. 7.
Figure 9:
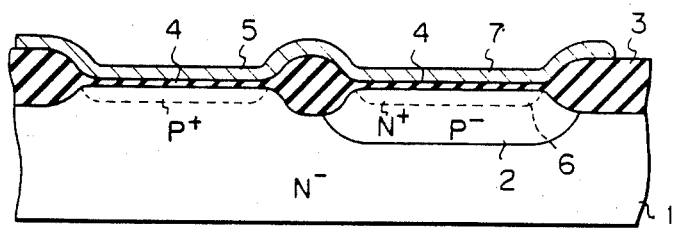

FIG. 6 is an equivalent circuit diagram of a complementary MIS (CMIS) basic cell. The basic cell is comprised of a pair of P-channel transistors $Q_{1p}$ and $Q_{2p}$ having a common source and a pair of N-channel transistors $Q_{1n}$ and $Q_{2n}$ having a common source. In this case, the gates of the P-channel transistor $Q_{1p}$ and the N-channel transistor $Q_{1n}$ are connected to each other, and the gates of the P-channel transistor $Q_{2p}$ and the N-channel transistor $Q_{2n}$ are connected to each other. Referring to FIG. 7, which is a plan view of the basic cell of FIG. 6, and FIGS. 8 and 9, which are cross-sectional views, reference numeral 1 designates an $N^-$-type monocrystalline silicon substrate 1 having a $P^-$-type well 2 for the N-channel transistors $Q_{1n}$ and $Q_{2n}$. Further, a field oxide layer 3 for isolating transistors (active areas) from each other is formed thereon, and a gate oxide layer 4 is formed on each active area. Further, $P^+$-type impurity diffusion regions 5 are formed for the P-channel transistors $Q_{1p}$ and $Q_{2p}$, and $N^+$-type impurity diffusion regions 5 are formed for the N-channel transistors $Q_{1n}$ and $Q_{2n}$. Finally, polycrystalline silicon layers 7 are formed for the connection of the gates of the transistors $Q_{1p}$ and $Q_{1n}$ and the connection of the gates of the transistors $Q_{2p}$ and $Q_{2n}$, thus completing the bulk process of a gate-array LSI. After that, as occasion demands, that is, as customers demand, connection patterns are formed on the basic cell as shown in FIGS. 6 through 9.

Returning to FIG. 5, as stated above, each inverter INV is constructed by a basic cell as shown in FIGS. 6 through 9. In this case, each inverter INV uses only two gates, e.g., the transistors $Q_{1p}$ and $Q_{1n}$, and does not use the other two gates, e.g., the transistors $Q_{2p}$ and $Q_{2n}$. In FIG. 5, when the potential at the input terminal IN is changed from high to low, the delay time period of the first stage is 0.77 ns; the delay time period of the second stage is 0.43 ns; the delay time period of the third stage is 0.77 ns; and the delay time period of the fourth stage is 0.71 ns. Therefore, the total delay time period is 2.68 ns. On the contrary, when the potential at the input terminal IN is changed from low to high, the delay time period of the first stage is 0.43 ns; the delay time period of the second stage is 0.77 ns; the delay time period of the third stage is 0.43 ns; and the delay time of the fourth stage is 1.32 ns. Therefore, the total delay time period is 2.95 ns.

In order to obtain a large delay time period, the delay circuit of FIG. 5 requires a large number of inverters stages, i.e., basic cells, occupying a large area.

In FIG. 7, which is a first embodiment of the present invention, P-channel transistors $Q_{1p}$, $Q_{2p}$, $Q_{3p}$, and $Q_{4p}$ are connected in series between a power supply terminal $V_{cc}$ and an output terminal OUT, and N-channel transistors $Q_{1n}$, $Q_{2n}$, $Q_{3n}$, and $Q_{4n}$ are connected in series between the output terminal OUT and the ground. Further, a load capacitance $C_L$ is connected to the output terminal OUT. The P-channel transistors $Q_{1p}$, $Q_{2p}$, $Q_{3p}$, and $Q_{4p}$ and the N-channel transistors $Q_{1n}$, $Q_{2n}$, $Q_{3n}$, and $Q_{4n}$ are all driven by the potential at the input terminal IN. For example, when the potential at the input terminal IN is low, the transistors $Q_{1p}$, $Q_{2p}$, $Q_{3p}$, and $Q_{4p}$ are in an on state, and the transistors $Q_{1n}$, $Q_{2n}$, $Q_{3n}$, and $Q_{4n}$ are in an off state. Therefore, the load capacitance $C_L$ is changed at $V_{cc}$ by the transistors $Q_{1p}$, $Q_{2p}$, $Q_{3p}$, and $Q_{4p}$, so that the potential at the output terminal OUT is high. On the other hand, when the potential at the input terminal IN is high, the transistors $Q_{1n}$, $Q_{2n}$, $Q_{3n}$, and $Q_{4n}$ are in an on state, and the transistors $Q_{1p}$, $Q_{2p}$, $Q_{3p}$, and $Q_{4p}$ are in an off state. Therefore, the load capacitance $C_L$ is discharged by the transistors $Q_{1n}$, $Q_{2n}$, $Q_{3n}$, and $Q_{4n}$, so that the potential at the output terminal OUT is low.

Figure 11A:
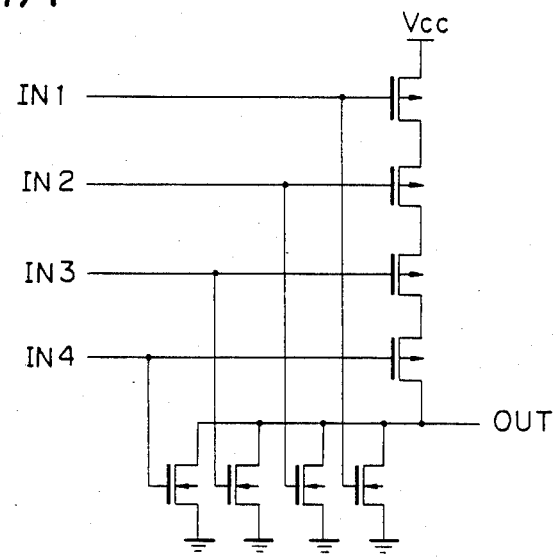
FIGS. 11A and 11B are circuit diagrams for explaining the operation of FIG. 10.

Therefore, when the potential at the input terminal IN is changed from high to low, the P-channel transistors $Q_{1p}$, $Q_{2p}$, $Q_{3p}$, and $Q_{4p}$ are sequentially turned on, in that order, and the N-channel transistors $Q_{4n}$, $Q_{3n}$, $Q_{2n}$, and $Q_{1n}$ are sequentially turned off, in that order, since the gate-source voltage of a P-channel transistor (N-channel transistor) on the outside is not smaller than the gate-source voltage of a P-channel transistor (N-channel transistor) on the inside. As a result, the output terminal OUT is charged by the P-channel transistors $Q_{1p}$, $Q_{2p}$, $Q_{3p}$, and $Q_{4p}$, so that its potential rises in the same way as the rise operation in a four-input NOR circuit as shown in FIG. 11A.

Figure 11B:
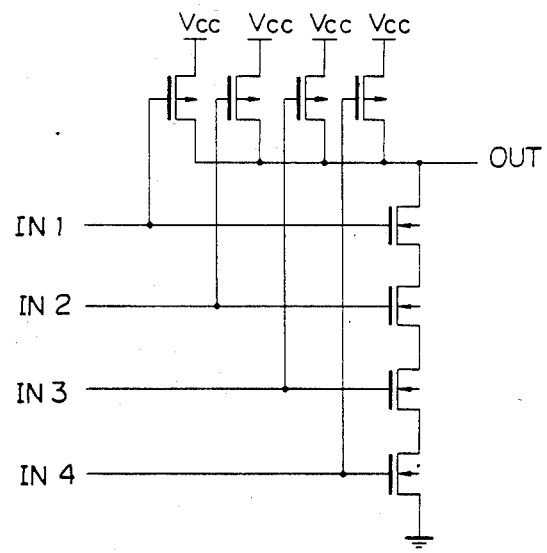

On the other hand, when the potential at the input terminal IN is changed from low to high, the N-channel transistors $Q_{1n}$, $Q_{2n}$, $Q_{3n}$, and $Q_{4n}$ are sequentially turned on, in that order, and the P-channel transistors $Q_{4p}$, $Q_{3p}$, $Q_{2p}$, and $Q_{1p}$ are sequentially turned off in that order, since, also in this case, the gate-source voltage of a P-channel transistor (N-channel transistor) on the outside is not smaller than the gate-source voltage of a P-channel transistor (N-channel transistor) on the inside. As a result, the output terminal OUT is discharged by the N-channel transistors $Q_{1n}$, $Q_{2n}$, $Q_{3n}$, and $Q_{4n}$, so that its potential falls in the same way as the fall operation in a four-input NAND circuit as shown in FIG. 11B.

Thus, since the P-channel transistors (or the N-channel transistors) are sequentially turned on from the outside to the inside, and the N-channel transistors (or the P-channel transistors) are turned on, the change of the potential at the output terminal OUT is delayed.

Figure 10:
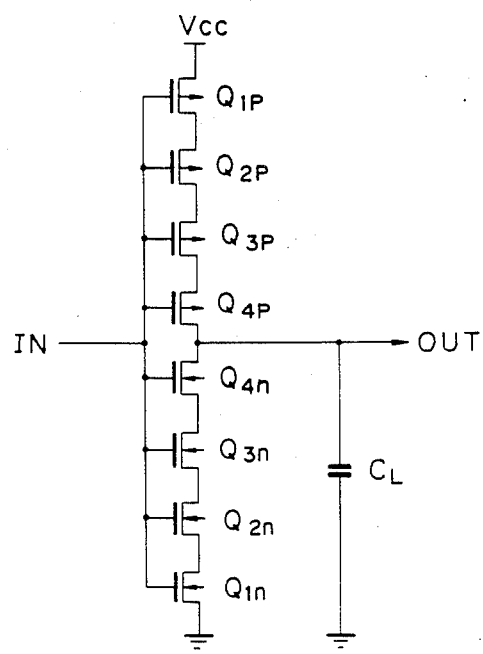
FIG. 10 is a circuit diagram of a first embodiment of the delay circuit according to the present invention.

Note that the fluctuation in the operation of the circuit of FIG. 10 is about the same as in conventional logic circuits.

Figure 12:
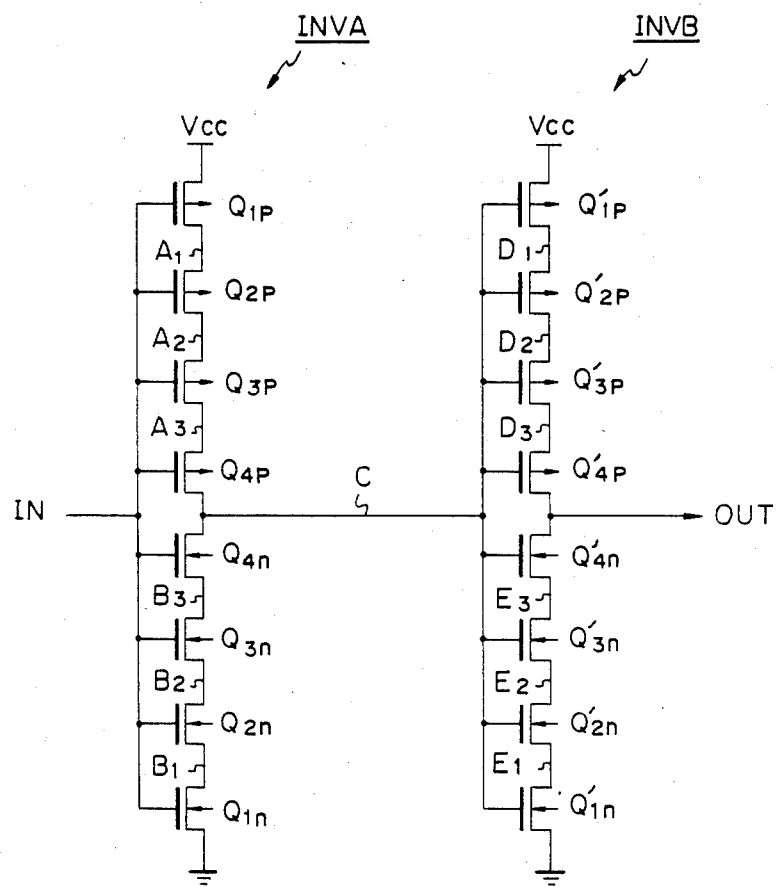
FIG. 12 is circuit diagram of a second embodiment of the delay circuit according to the present invention.

In FIG. 12, which is a circuit diagram of a second embodiment of the delay circuit according to the present invention, two inverters as shown in FIG. 10 are provided. That is, an inverter INVA is comprised of P-channel transistors $Q_{1p}$, $Q_{2p}$, $Q_{3p}$, and $Q_{4p}$ and N-channel transistors $Q_{1n}$, $Q_{2n}$, $Q_{3n}$, and $Q_{4n}$ connected in series, and an inverter INVB is comprised of P-channel transistors $Q_{1p}'$, $Q_{2p}'$, $Q_{3p}'$, and $Q_{4p}'$ and N-channel transistors $Q_1'$, $Q_2'$, $Q_3'$, and $Q_4'$ connected in series.

In FIG. 12, the potential at the input terminal IN is applied to the gates of the transistors $Q_{1p}$, $Q_{2p}$, $Q_{3p}$, $Q_{4p}$, $Q_{1n}$, $Q_{2n}$, $Q_{3n}$, and $Q_{4n}$ of the inverter INVA. Accordingly, these transistors are driven by the potential at the input terminal IN. Also, the common output C of the innermost pair of the P-channel/N-channel transistors $Q_{4p}$ and $Q_{4n}$ of the inverter INVA is applied to the gates of the transistors $Q_{1p}'$, $Q_{2p}'$, $Q_{3p}'$, $Q_{4p}'$, $Q_{1N}'$, $Q_{2n}'$, $Q_{3n}'$, and $Q_{4n}'$ of the inverter INVB. Accordingly, these transistors are driven by the potential at the output C. Also, the common output of the innermost pair of the P-channel/N-channel transistors $Q_{4p}'$ and $Q_{4n}'$ of the inverter INVB is connected to the output terminal OUT.

Note that, if the circuit of FIG. 12 is constructed by basic cells each having four two-input gates, as shown in FIGS. 6 through 9, the transistors $Q_{1p}$, $Q_{2p}$, $Q_{1n}$, and $Q_{2n}$ can be constructed by one basic cell; the transistors $Q_{3p}$, $Q_{4p}$, $Q_{3n}$, and $Q_{4n}$ can be constructed by one basic cell; the transistors $Q_{1p}'$, $Q_{2p}'$, $Q_{1n}'$, and $Q_{2n}'$ can be constructed by one basic cell; and the transistors $Q_{3p}'$, $Q_{4p}'$, $Q_{3n}'$, and $Q_{4n}'$ can be constructed by one basic cell. Therefore, the circuit of FIG. 12 can be constructed by four basic cells in the same way as in the circuit of FIG. 5.

Figure 13:
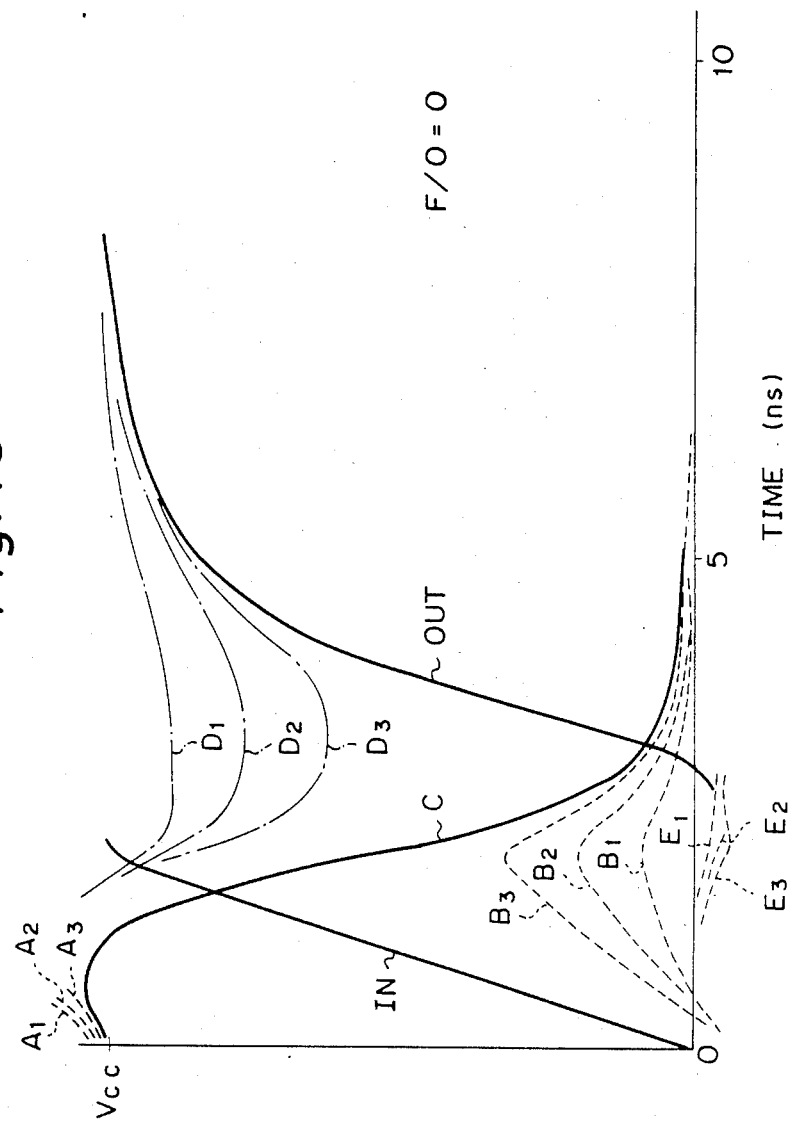
FIGS. 13 through 16 are timing diagrams showing the operation of the circuit of FIG. 12.
Figure 14:
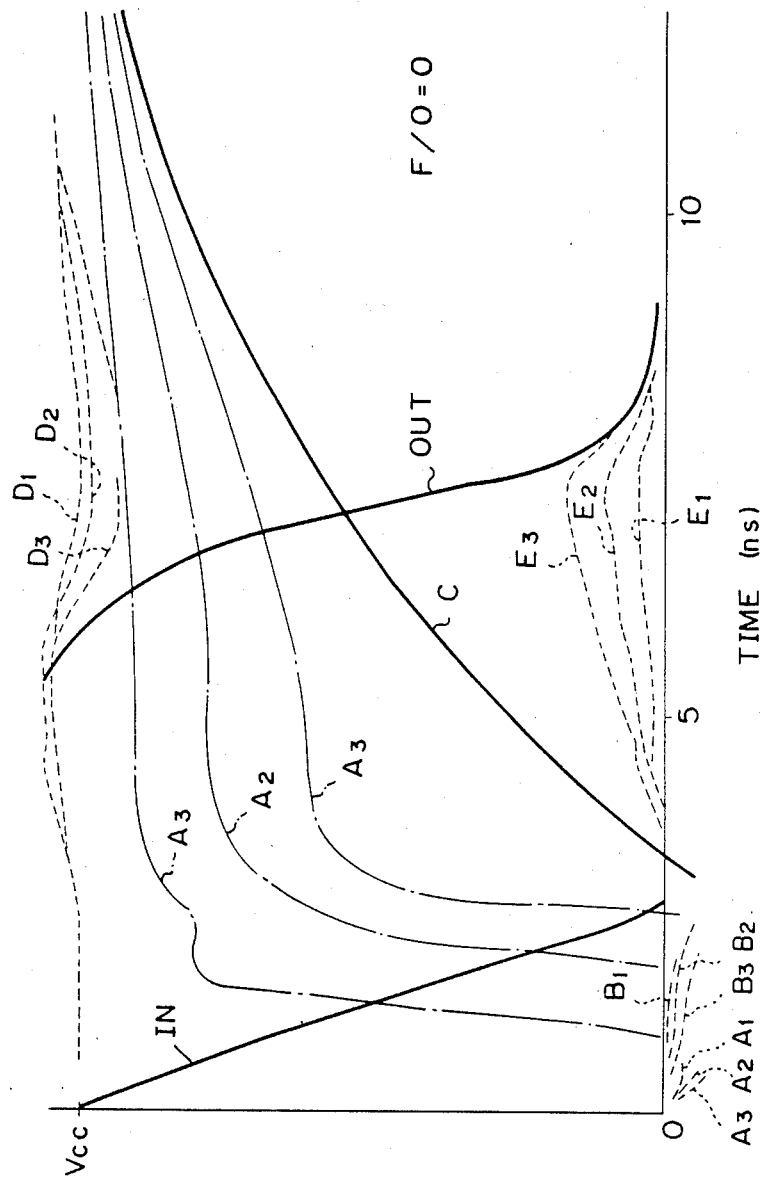
Figure 15:
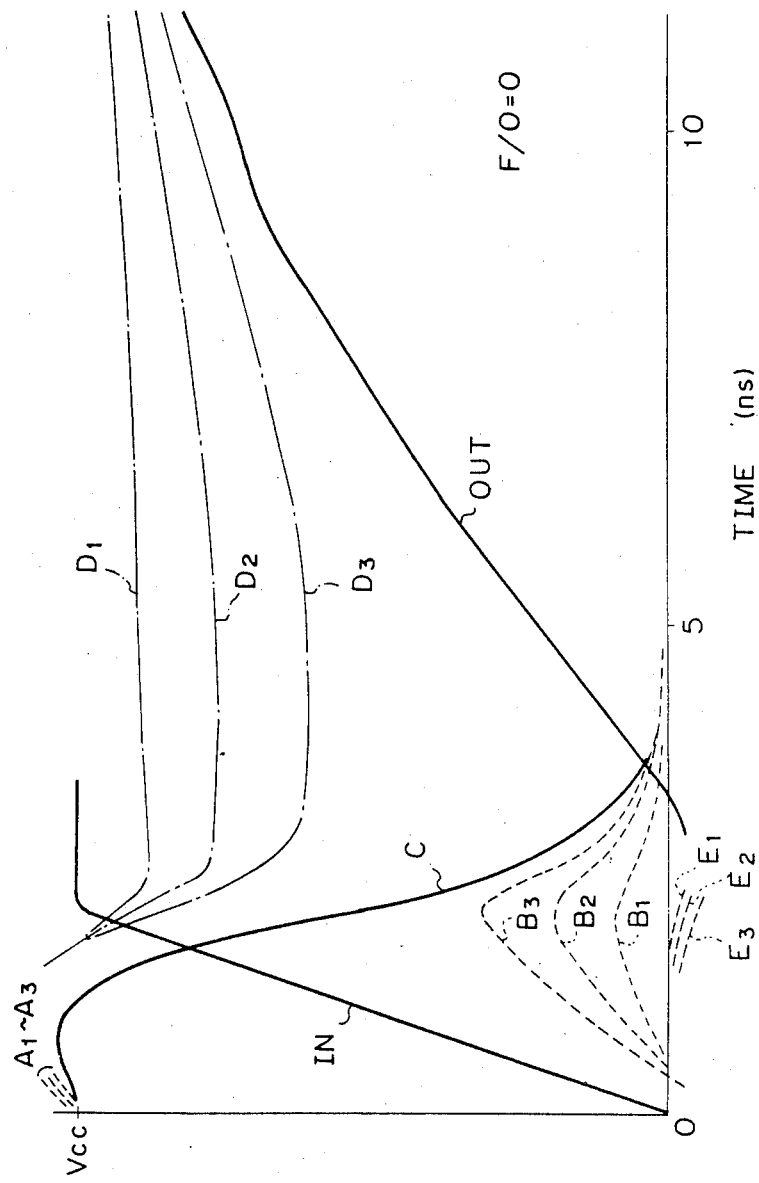
Figure 16:
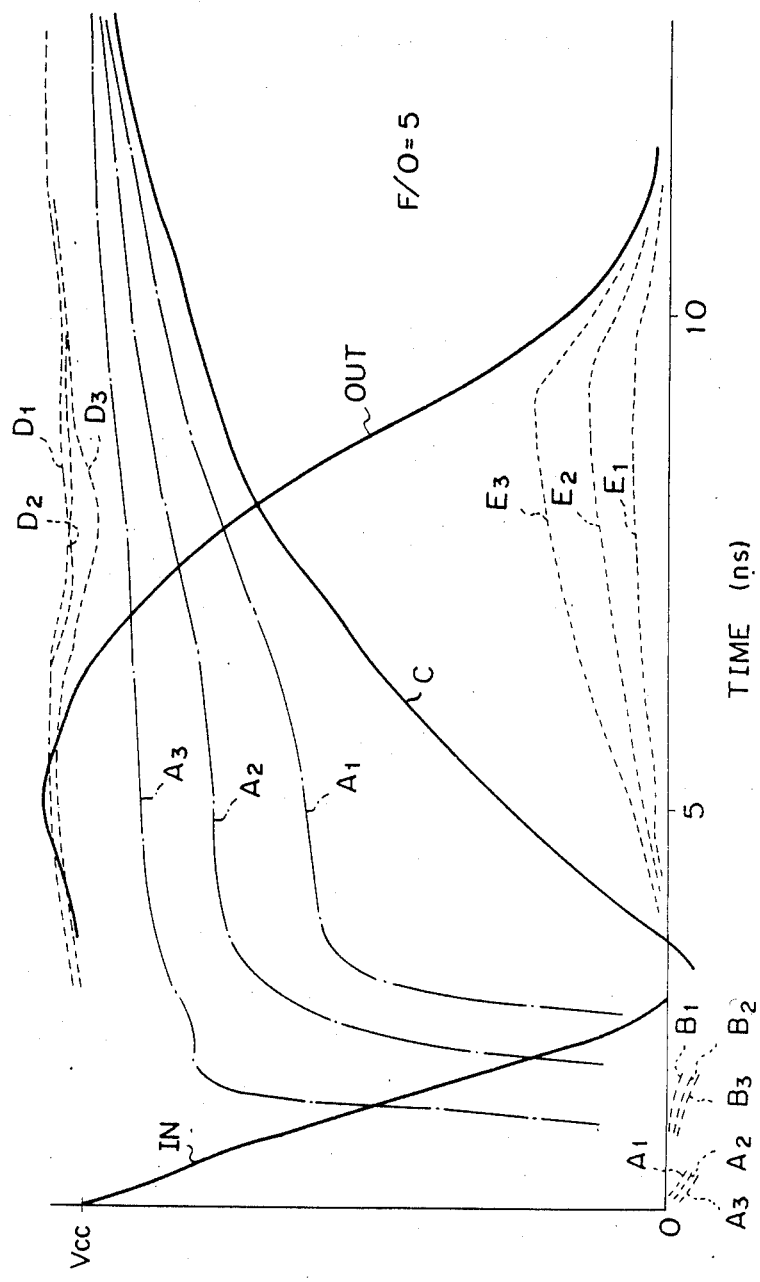

The operation of the circuit of FIG. 12 is shown in FIGS. 13 through 16. FIG. 13 shows the case wherein the fan-out (F/O) is 0 and wherein the potential at the input terminal IN is changed from low to high; FIG. 14 shows the case wherein the fan-out (F/O) is 0 and wherein the potential at the input terminal IN is changed from high to low; FIG. 15 shows the case wherein the fan-out (F/O) is 5 and wherein the potential at the input terminal IN is changed from low to high; and FIG. 16 shows the case wherein the fan-out (F/O) is 5 and wherein the potential at the input terminal IN is changed from high to low.

Referring to FIG. 13, first, if the potential at the input terminal IN is low, the P-channel transistors $Q_{1p}$, $Q_{2p}$, $Q_{3p}$, and $Q_{4p}$ are in an on state, and the N-channel transistors $Q_{1n}$, $Q_{2n}$, $Q_{3n}$, and $Q_{4n}$ are in an off state, and, accordingly, the potential at the node C is high. Therefore, in the inverter INVB, P-channel transistors $Q_{1p}$, $Q_{2p}$, $Q_{3p}$, and $Q_{4p}$ are in an off state, and the N-channel transistors $Q_{1n}$, $Q_{2n}$, $Q_{3n}$, and $Q_{4n}$ are in an on state, and accordingly, the potential at the output terminal OUT is low. In this state, when the potential at the input terminal IN is changed from low to high, the N-channel transistors $Q_{1n}$, $Q_{2n}$, $Q_{3n}$, and $Q_{4n}$ tend to be in an on state, while the transistors $Q_{1p}$, $Q_{2p}$, $Q_{3p}$, and $Q_{4p}$ tend to be in an off state. At this time, when the change of the potential at the input terminal IN is rather rapid, the potentials at the nodes $A_1$, $A_2$, $A_3$, and C temporarily rise up to a level higher than the power supply potential $V_{cc}$ by the gate-source capacitance of each of the transistors $Q_{1p}$ to $Q_{4p}$ and $Q_{rn}$. Then, as the transistors $Q_{1n}$, $Q_{2n}$, $Q_{3n}$, and $Q_{4n}$ become in an on state, the node C is discharged via these transistors. As a result, the potential at the node C is reduced, and simultaneously, the potentials at the nodes $B_1$, $B_2$, and $B_3$ change toward their DC stable points determined by the impedance ratio of the transistors. In addition, as the potential at the node C is reduced, the transistors $Q_{1p}'$, $Q_{2p}'$, $Q_{3p}'$, and $Q_{4p}'$ tend to be in an on state, and accordingly, the potentials at the nodes $D_1$, $D_2$, and $D_3$ change toward a DC stable point determined by the impedance ratio of the transistors $Q_{1p}'$, $Q_{2p}'$, $Q_{3p}'$, and $Q_{4p}'$. At this time, the potentials at the nodes $E_1$, $E_2$, and $E_3$ become lower than the ground level due to the rapid reduction of the potential at the node C.

Next, when the potential at the input terminal IN becomes a sufficiently high level, the transistors $Q_{1n}$, $Q_{2n}$, $Q_{3n}$, and $Q_{4n}$ are completely in an on state. Therefore, the potentials at the nodes C, $B_1$, $B_2$, and $B_3$ are reduced by the discharging operation. Note that, at this time, since the transistors $Q_{1p}$, $Q_{2p}$, $Q_{3p}$, and $Q_{4p}$ are completely in an off state, the potentials at the nodes $E_1$, $E_2$, and $E_3$ become levels in accordance with the impedance determined by the leakage currents of the transistors $Q_{1n}'$, $Q_{2n}'$, $Q_{3n}'$, and $Q_{4n}'$ after a sufficient time period passes.

Thus, the potential at the output terminal OUT is changed by the discharging operation of the transistors $Q_{1p}'$, $Q_{2p}'$, $Q_{3p}'$, and $Q_{4p}'$, and the transistors $Q_{1n}$, $Q_{2n}$, $Q_{3n}$, and $Q_{4n}$. However, in this case, a charging and discharging operation is carried out by a large number of transistors, thereby increasing the delay time period.

In addition, when the potential at the input terminal IN is changed from high to low, the potential at each node is changed as shown in FIG. 14. A detailed explanation is omitted, since it is similar to that of FIG. 13, however, in this case, the potential at the output terminal OUT is changed by the discharging operation of the transistors $Q_{1p}$, $Q_{2p}$, $Q_{3p}$, and $Q_{4p}$ and and the transistors $Q_{1n}'$, $Q_{2n}'$, $Q_{3n}'$, and $Q_{4n}'$.

Note that, in the case wherein the fan-out is 5, FIG. 13 is replaced by FIG. 15, and FIG. 14 is replaced by FIG. 16. That is, the waveform at the output terminal OUT is blunt and the delay time period is further increased.

In any case, a delay time period having a time larger than 5 ns can be obtained, and therefore, is larger than that of FIG. 5.

Note that, in the above-mentioned embodiments of FIGS. 10 and 12, each of the inverters has the same number of P-channel transistors and N-channel transistors connected in series. Any number can be, of course, selected, however.

Figure 17:
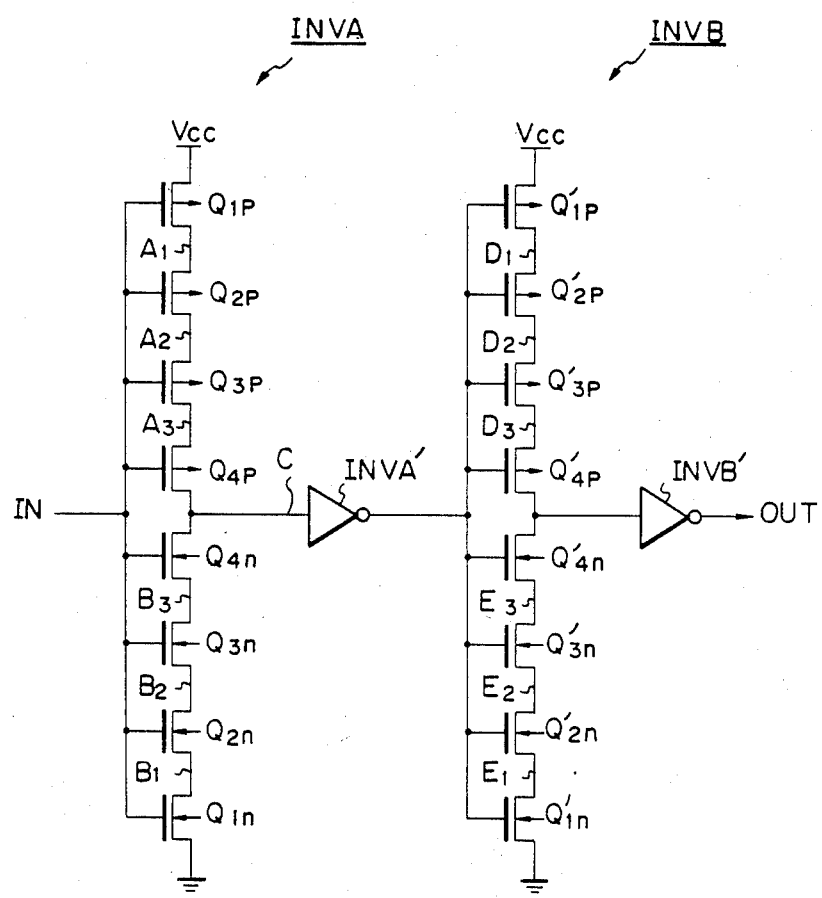
FIG. 17 is a circuit diagram of a third embodiment of the delay circuit according to the present invention.

In FIG. 17, which illustrates a third embodiment of the present invention, two inverters INVA' and INVB' are added to the circuit of FIG. 12. That is, the inverter INVA' is interposed between the inverters INVA and INVB, and the inverter INVB' is connected to the output of the inverter INVB. The inverters INVA' and INVB' serve as wave-shaping means. Each of them is constructed by two gates of one basic cell, as shown in FIGS. 6 through 9.

Figure 18:
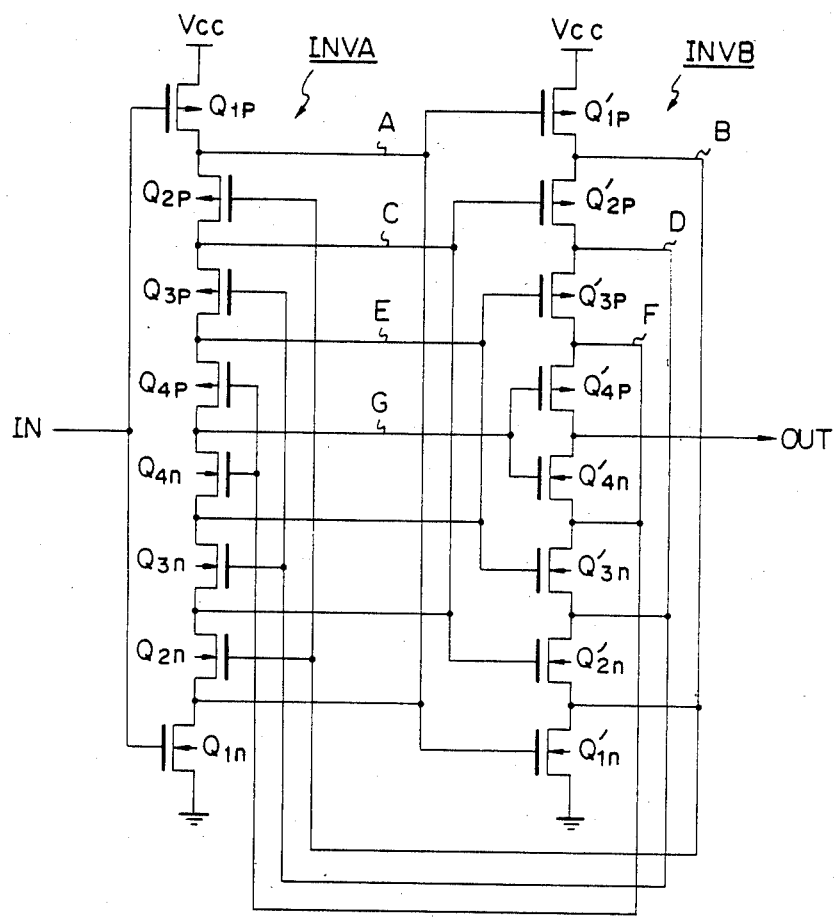
FIG. 18, is a circuit diagram of a fourth embodiment of the delay circuit according to the present invention.

In FIG. 18, which illustrates a fourth embodiment of the present invention, two inverters INVA and INVB are also provided. In the inverter INVA, each pair of P-channel/N-channel transistors $Q_{1p}$ and $Q_{1n}$; $Q_{2p}$ and $Q_{2n}$; $Q_{3p}$ and $Q_{3n}$; and $Q_{4p}$ and $Q_{4n}$ form one inverter. Similarly, in the inverter INVB, each pair of P-channel/N-channel transistors $Q_{1p}'$ and $Q_{1n}'$; $Q_{2p}'$ and $Q_{2n}'$; $Q_{3p}'$ and $Q_{3n}'$; and $Q_{4p}'$ and $Q_{4n}'$ forms one inverter.

Figure 19:
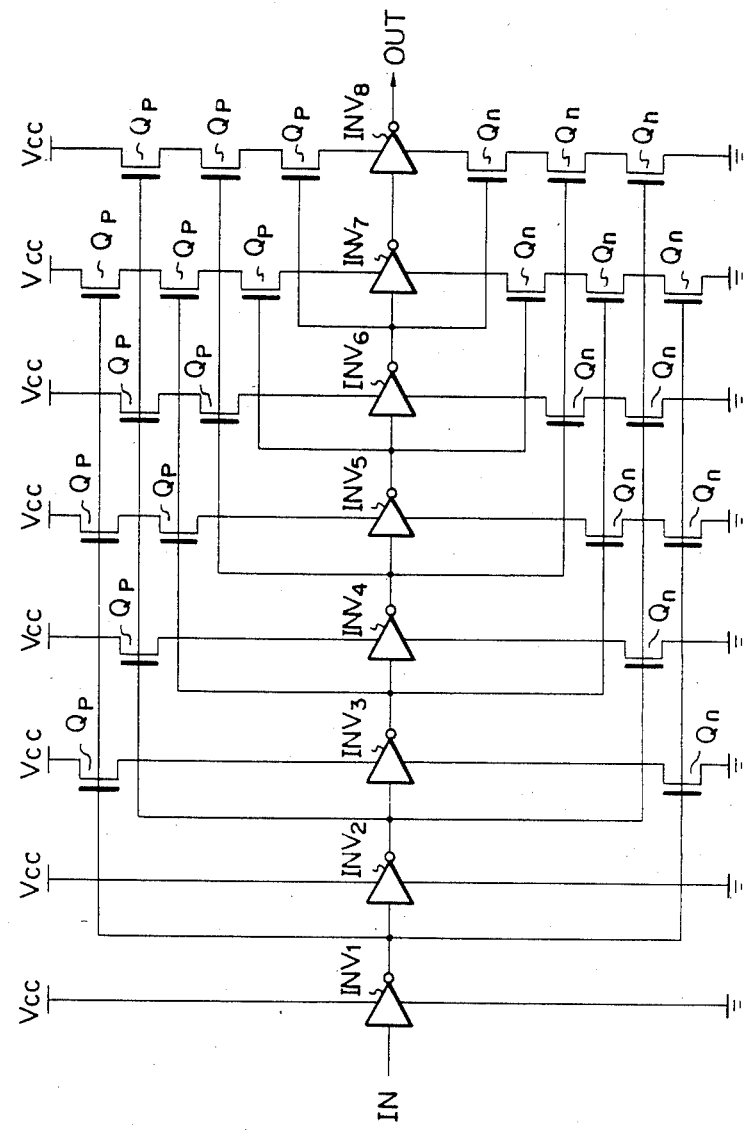
FIGS. 19 and 20 are circuit diagrams for explaining the operation of FIG. 18.
Figure 20:
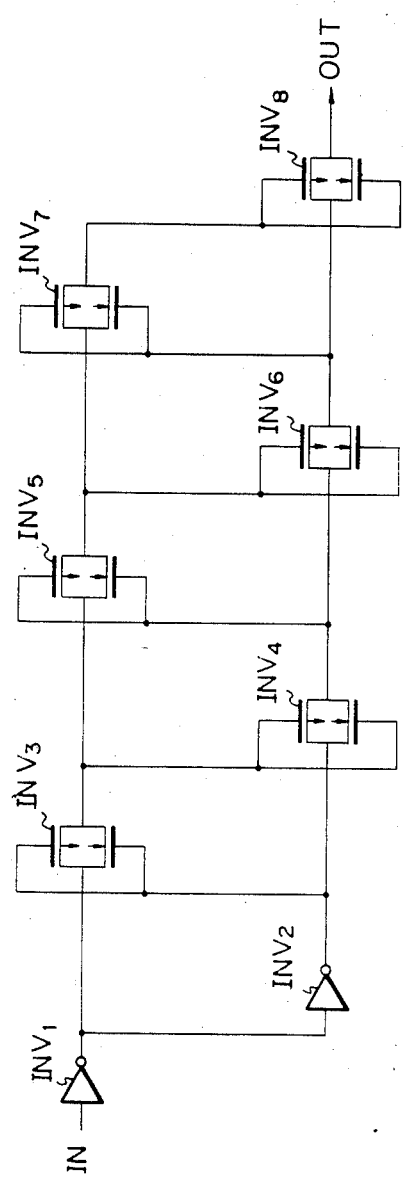

Here, if the pairs of the transistors $Q_{1p}$ and $Q_{1n}$; $Q_{1p}'$ and $Q_{1n}'$; $Q_{2p}$ and $Q_{2n}$; $Q_{2p}'$ and $Q_{2n}'$; $Q_{3p}$ and $Q_{3n}$; $Q_{3p}'$ and $Q_{3n}'$; $Q_{4p}$ and $Q_{4n}$; and $Q_{4p}'$ and $Q_{4n}'$ were defined by inverters $INV_1$, $INV_2$, $INV_3$, $INV_4$, $INV_5$, $INV_6$, $INV_7$, and $INV_8$, respectively, the circuit of FIG. 18 would be as schematically illustrated in FIG. 19. Note that the P-channel transistors $Q_p$ and N-channel transistors $Q_n$ of FIG. 19 are absent in FIG. 18. They are provided in FIG. 19 only for easy understanding of the operation thereof. Further, if the inverters INV$_3$ to INV$_8$ were defined by transfer gates, the circuit of FIG. 18 would be as schematically illustrated in FIG. 20.

That is, in FIG. 18, the inverter INV$_1$ ($Q_{1p}$, $Q_{1n}$) is driven by the potential at the input terminal IN; the inverter INV$_2$ ($Q_{1p}'$, $Q_{1n}'$) is driven by the output A of the inver INV$_1$; the inverter INV$_3$ ($Q_{2p}$, $Q_{2n}$) is driven by the output B of the inverter INV$_2$; the inverter INV$_4$ ($Q_{2p}'$, $Q_{2n}'$) is driven by the output C of the inverter the inverter INV$_3$; the inverter INV$_5$ ($Q_{3p}$, $Q_{3n}$) is driven by the output D of the inverter INV$_4$; the inverter INV$_6$ ($Q_{3p}'$, $Q_{3n}'$) is driven by the output E of the inverter INV$_5$; the inverter INV$_7$ ($Q_{4p}$, $Q_{4n}$) is driven by the output F of the inverter INV$_6$; the inverter INV$_8$ ($Q_{4p}'$, $Q_{4n}'$) is driven by the output G of the inverter INV$_8$; and the output of the inverter INV$_8$ becomes the potential at the output terminal OUT.

Thus, the output of each inverter of the post-stage inverter INVB is fed back to the input of each inverter of the pre-stage inverter INVA. Accordingly, the driving power of each inverter (INV$_1$ to INV$_8$) is reduced, thereby increasing the delay time period.

Note that, if the circuit of FIG. 18 is constructed by basic cells each having four two-input gates as shown in FIGS. 6 through 9, the circuit of FIG. 18 can be constructed by four basic cells in the same way as in the circuit of FIG. 12.

The operation of the circuit of FIG. 18 is shown in FIGS. 21 through 24.

Figure 21:
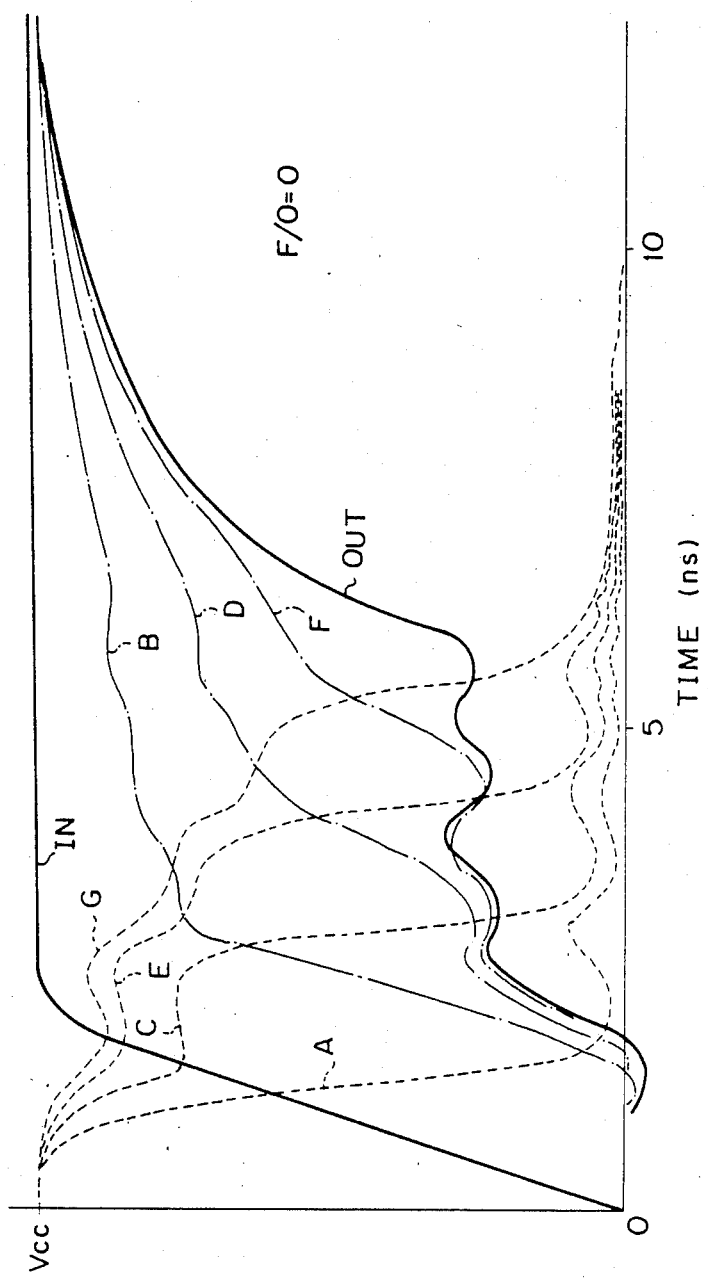
FIGS. 21 through 24 are timing diagrams showing the operation of the circuit of FIG. 18.
Figure 22:
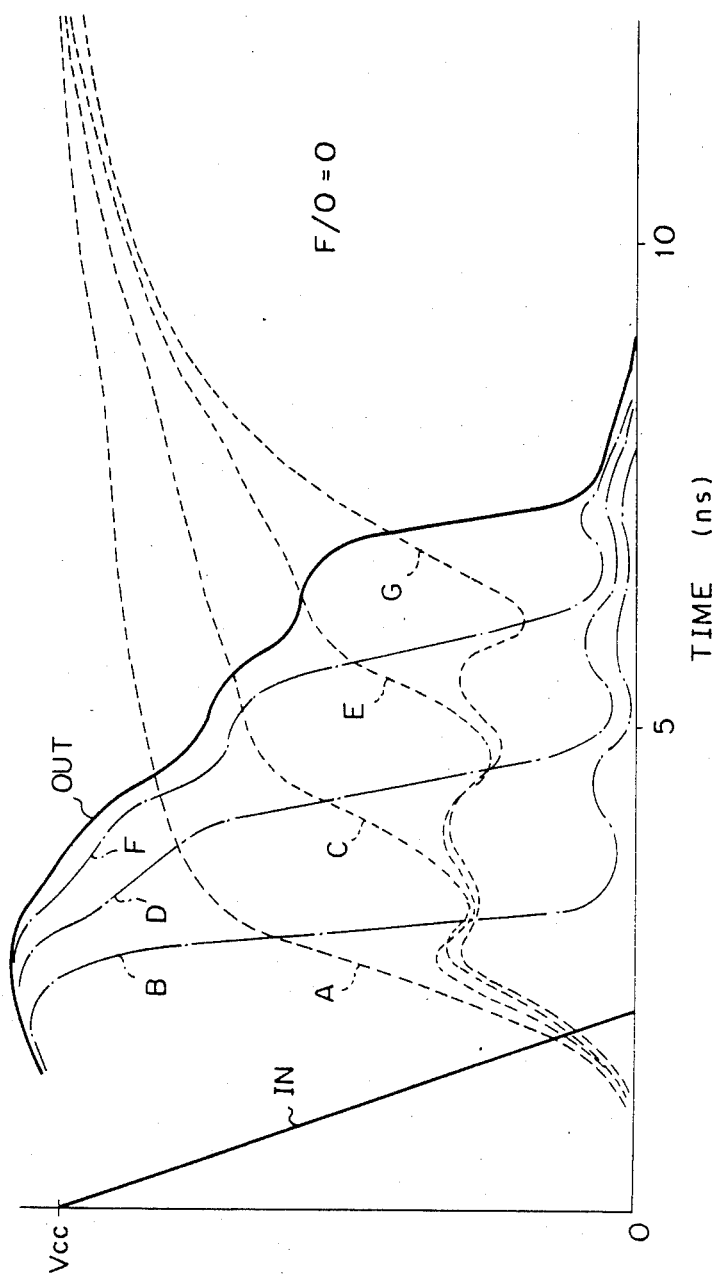
Figure 23:
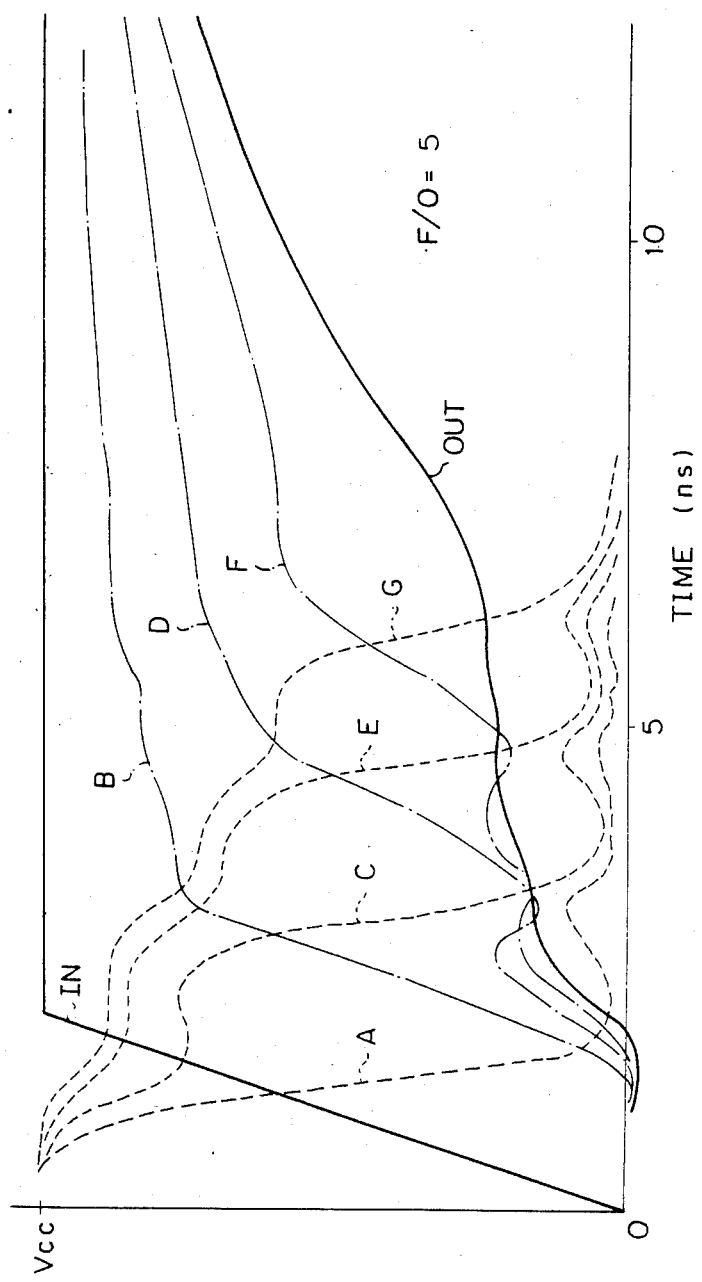
Figure 24:
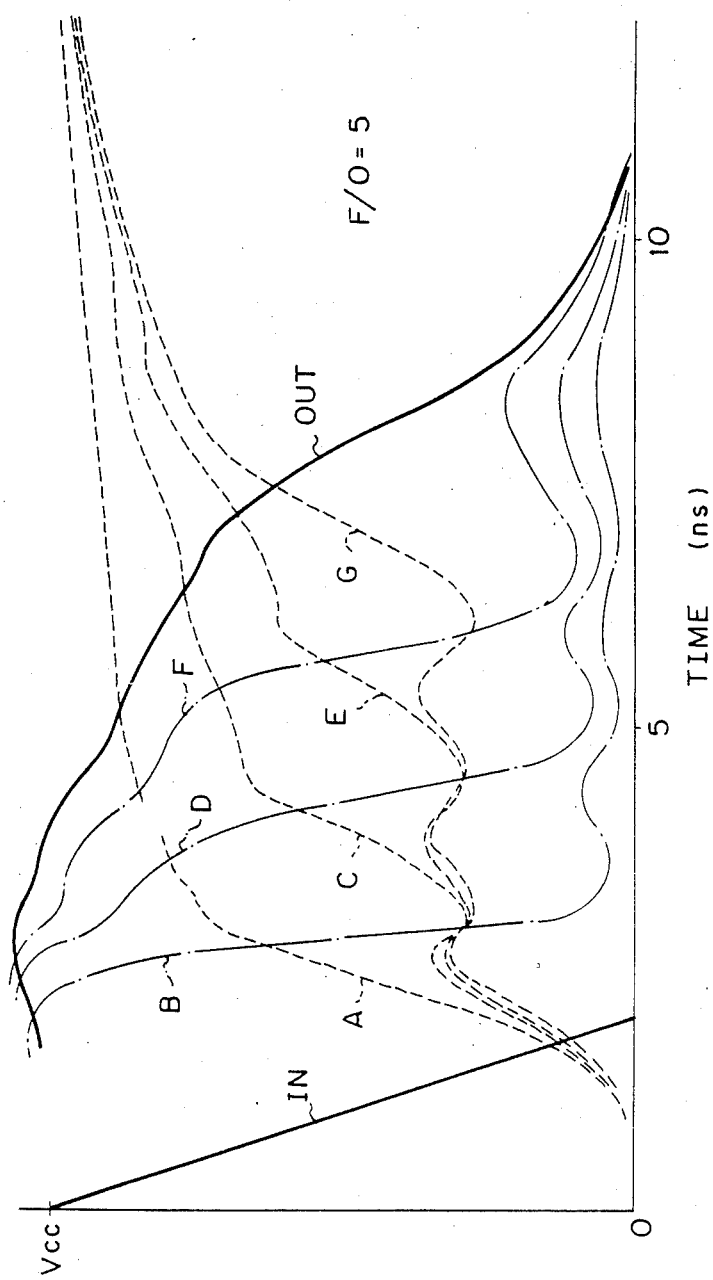

FIGS. 21 through 24 correspond to FIGS. 13 through 16, respectively. That is, FIG. 21 shows the case wherein the fan-out (F/O) is 0 and wherein the potential at the input terminal IN is changed from low to high; FIG. 22 shows the case wherein the fan-out (F/O) is 0 and wherein the potential at the input terminal IN is changed from high to low; FIG. 23 shows the case wherein the fan-out (F/O) is 5 and wherein the potential at the input terminal IN is changed from low to high; and FIG. 24 shows the case wherein the fan-out (F/O) is 5 and wherein the potential at the input terminal IN is changed from high to low.

Referring to FIG. 21, it is assumed that the potentials at the input terminal IN, the outputs B, D, F, and the output terminal OUT are low, and the potentials at the outputs A, C, E, and G are high. At this time, when the potential at the input terminal IN is changed from low to high, the transistor $Q_{1p}$ is turned off and the transistor $Q_{1n}$ is turned on. As a result, the potential at the output A of the inverter INV$_1$ ($Q_{1p}$, $Q_{1n}$) is reduced. At this time, since the transistors $Q_{2p}$, $Q_{3p}$, and $Q_{4p}$ are still in an on state, the potentials at the outputs C, E, and G are also reduced. Such a potential reduction continues until the output B of the inverter INV$_2$, ($Q_{1p}'$, $Q_{1n}'$) reaches the threshold value of the P-channel transistor $Q_{2p}$. On the other hand, as the potential at the output A is reduced, the potential at the output B of the inverter INV$_2$ ($Q_{1p}'$, $Q_{1n}'$) rises. However, in this case, since the the transistors $Q_{2n}'$, $Q_{3n}'$, and $Q_{4n}'$ are still in an on state, the potentials at the output D, F, and the output terminal OUT are increased simultaneously with the rise of the potential of the output B. When the potential at the output B reaches the above-mentioned threshold value, the transistor $Q_{2p}$ is cut off, and the discharge at the outputs C, E, and G temporarily ceases. Further, when the potential at the output B increases, the potential at the output C remains temporarily at the same level and, accordingly, the transistor $Q_{2n}'$ is cut off. As a result, only the potential at the output B increases. Therefore, the output C of the inverter INV$_3$ ($Q_{2p}$, $Q_{2n}$) is again reduced. At this time, since the transistors $Q_{3p}$ and $Q_{4p}$ are still in an on state, the potentials at the outputs E and G are also reduced. Such a potential reduction continues until the output D of the inverter INV$_4$ ($Q_{2p}'$, $Q_{2n}'$) reaches the threshold value of the P-channel transistor $Q_{3p}$. When the potential at the output D reaches this threshold value, the transistor $Q_{3p}$ is cut off, and the discharge at the outputs E and G temporarily ceases. Further, when the potential at the output D increases, the potential at the output E remains temporarily at the same level, and accordingly, the transistor $Q_{3n}'$ is cut off. As a result, only the potential at the output E increases. At this time, since the transistor $Q_{4p}$ is still in an on state, the potential at the output G is also reduced. Such a potential reduction continues until the output F of the inverter INV$_6$ ($Q_{3p}'$, $Q_{3n}'$) reaches the threshold value of the P-channel transistor $Q_{4p}$. When the potential at the output F reaches this threshold value, the transistor $Q_{4p}$ is cut off, and the discharge at the output G temporarily ceases. Further, when the potential at the output F increases, the potential at the output G remains temporarily at the same level. Accordingly, the transistor $Q_{4n}'$ is cut off. As a result, only the potential at the output F increases. Therefore, the output G of the inverter INV$_7$ ($Q_{4p}$, $Q_{4n}$) is again reduced, so that the potential at the output terminal OUT rises.

Contrary to the above, in a state where the potentials at the input terminal IN, the outputs B, D, F, and the output terminal OUT are high and the potentials at the outputs A, C, E, and G are low, when the potential at the input terminal IN is changed from high to low, the potential at each node is changed as shown in FIG. 22. A detailed explanation thereof is omitted, since it is similar to that of FIG. 21.

Thus, since saddle points are generated in the change of the potentials at the outputs C, E, and G and at the outputs B, D, and F, the delay time period is increased.

Note that, in the case wherein the fan-out is 5, FIG. 21 is replaced by FIG. 23 and FIG. 22 is replaced by FIG. 24. That is, the waveform at the output terminal OUT is blunt and the delay time period is further increased.

In any case, a delay time period having a time larger than 5 ns can be obtained and therefore, is larger than that of FIG. 5.

Figure 25:
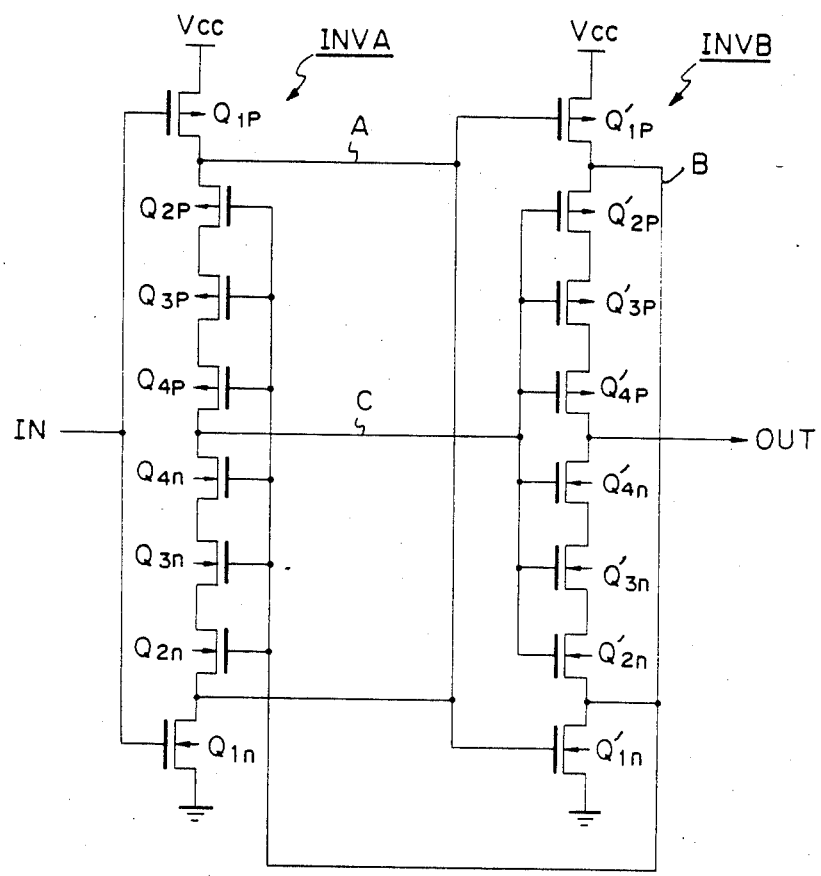
FIG. 25 is a circuit diagram of a fifth embodiment of the delay circuit according to the present invention.

In FIG. 25, which illustrates a fifth embodiment of the present invention similar to the fourth embodiment as shown in FIG. 18, the inverters INV$_3$ ($Q_{2p}$, $Q_{2n}$), INV$_5$ ($Q_{3p}$, $Q_{3n}$), and INV$_7$ ($Q_{4p}$, $Q_{4n}$) of the inverter INVA are driven simultaneously by the output B of the inverter INV$_2$($Q_{1p}'$, $Q_{1n}'$) of the inverter INVB, and the inverters INV$_4$ ($Q_{2p}'$, $Q_{2n}'$), INV$_6$ ($Q_{3p}'$, $Q_{3n}'$), and INV$_8$ ($Q_{4p}'$, $Q_{4n}'$) of the inverter INVB are driven simultaneously by the output of the inverter INV$_7$ ($Q_{4p}$, $Q_{4n}$) of the inverter INVA. In this circuit of FIG. 25, in a state where the potentials at the input terminal IN and the output B are high, and the potentials at the outputs A and C are low, when the potential at the input terminal IN is changed from high to low, the output A is changed from low to high. At this time, since the potential at the output C is low, the P-channel transistors $Q_{2p}'$, $Q_{3p}'$, and $Q_{4p}'$ are in an on state, while, since the potential at the output A is high, the N-channel transistor $Q_{1n}'$ is in an on state. Therefore, the potential at the output B changes toward the PC stable point determined by the impedance ratio of the transistors $Q_{2p}'$, $Q_{3p}'$, and $Q_{4p}'$ to the transistor $Q_{1n}'$. As a result, the P-channel transistors $Q_{2p}$, $Q_{3p}$, and $Q_{4p}$ and the N-channel transistors $Q_{2n}$, $Q_{3n}$, and $Q_{4n}$ tend to be in an on state, and accordingly, the high potential at the output A is transmitted to the output C. Therefore, the output C becomes high, so that the potential at the output terminal OUT becomes low. In such a configuration, unstable waveforms are hardly over generated in the output terminal OUT as compared with the embodiment of FIG. 18.

Thus, in FIGS. 18 and 25, since the driving power of each inverter included in the inverters INVA and INVB is reduced by the feedback control thereof, the delay time period is increased as compared with the embodiment of FIG. 12.

Figure 26:
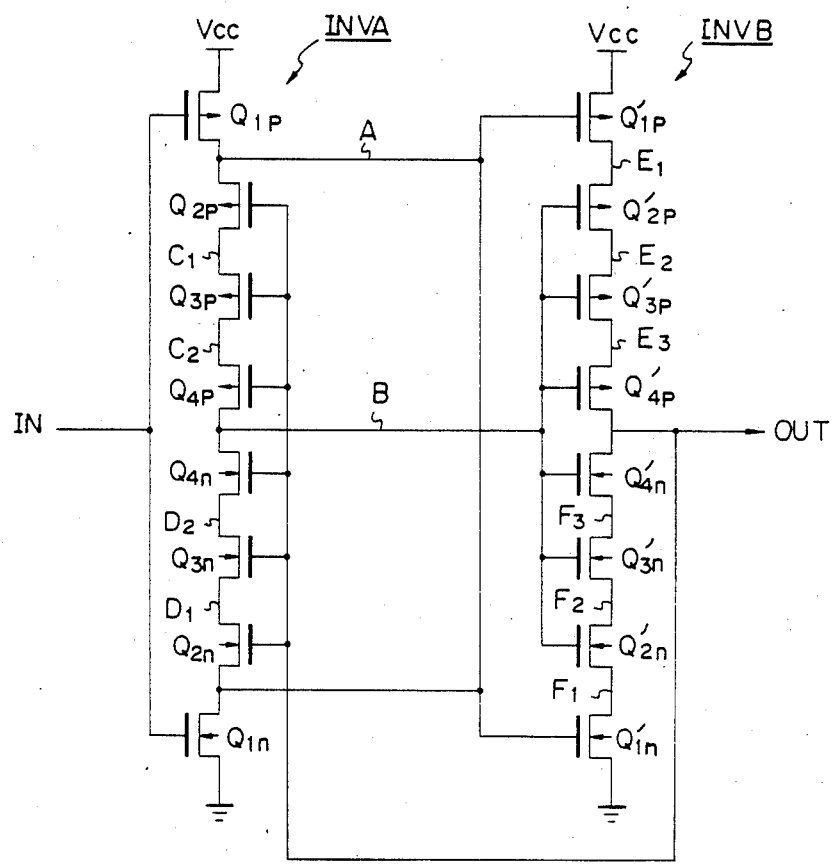
FIG. 26 is a circuit diagram of a sixth embodiment of the delay circuit according to the present invention.

In FIG. 26, which illustrates a sixth embodiment of the present invention similar to the embodiment of FIG. 25, the inverters $INV_3$ ($Q_{2p}$, $Q_{2n}$), $INV_5$ ($Q_{3p}$, $Q_{3n}$), and $INV_7$ ($Q_{4p}$, $Q_{4n}$) of the inverter INVA are driven by the potential at the output terminal OUT, not the output of the inverter $INV_2$ ($Q_{1p}'$, $Q_{1n}'$) of the inverter INVB.

The operation of t circuit of FIG. 26 will be explained with reference to FIGS. 27 and 28.

In FIG. 28, in an initial state, the potentials at the input terminal IN and the output terminal OUT are low. At this time, since the transistors $Q_{1p}$ to $Q_{4p}$ are in an on state, the potentials at the nodes A, $C_1$, $C_2$, and B are high, and accordingly, the transistors $Q_{1n}'$ to $Q_{4n}'$ are in an on state, so that the potentials at nodes $F_1$, $F_2$, and $F_3$ are low. In this state, when the potential at the input terminal IN is changed from low to high, the potential at the output A of the inverter $INV_1$ ($Q_{1p}$, $Q_{1n}$) is reduced. At this time, since the transistors $Q_{2p}$, $Q_{3p}$, and $Q_{4p}$ are still in an on state, the potentials at the nodes $C_1$ and $C_2$ and at the node B are also decreased with the decrease of the potential A. As a result, as the potential at the node B falls, the transistors $Q_{4p}'$, $Q_{3p}'$, and $Q_{2p}'$ tend to be in an on state, so that the nodes $E_1$, $E_2$, and $E_3$ are discharged to decrease the potentials thereof. Instead, the potentials at the output terminal OUT and the nodes $F_1$, $F_2$, and $F_3$ are increased. Such an unstable state continues until the potential at the output terminal OUT reaches the threshold value of the P-channel transistor $Q_{2p}$. When the potential at the output terminal OUT reaches this threshold value, the transistors $Q_{2p}$, $Q_{3p}$, and $Q_{4p}$ are cut off to again decrease the potential at the node B.

Thus, although the potential at the node A rapidly ends its rise, there is generated a temporary saddle point in the potential at the node B, thereby increasing the delay time period.

In FIG. 28, in an initial state, the potentials at the input terminal IN and the output terminal OUT are high. At this time, since the transistors $Q_{1n}$ to $Q_{4n}$ are in an on state, the potentials at the nodes A, $D_1$, $D_2$, and B are low. Accordingly, the transistors $Q_{1p}'$ to $Q_{4p}'$ are in an on state, so that the potentials at nodes $E_1$, $E_2$, and $E_3$ are high. In this state, when the potential at the input terminal IN is changed from low to high, the potential at the output A of the inverter $INV_1$ ($Q_{1p}$, $Q_{1n}$) is increased. At this time, since the transistors $Q_{2n}$, $Q_{3n}$, and $Q_{4n}$ are still in an on state, the potentials at the nodes $D_1$ and $D_2$ and at the node B are also increased with the increase of the potential A. As a result, as the potential at the node B rises, the transistors $Q_{4n}'$, $Q_{3n}'$, and $Q_{2n}'$ tend to be in an on state, so that the nodes $F_1$, $F_2$, and $F_3$ are charged to increase the potentials thereof. Instead, the potentials at the output terminal OUT and the nodes $E_1$, $E_2$, and $E_3$ are reduced. Such an unstable state continues until the potential at the output terminal OUT reaches the threshold value of the N-channel transistor $Q_{4n}$. When the potential at the output terminal OUT reaches this threshold value, the transistors $Q_{2n}$, $Q_{3n}$, and $Q_{4n}$ are cut off to again increase the potential at node B.

Thus, although the potential at the node A rapidly ends its rise, there is generated a temporary saddle point in the potential at the node B, thereby increasing the delay time period.

Figure 27:
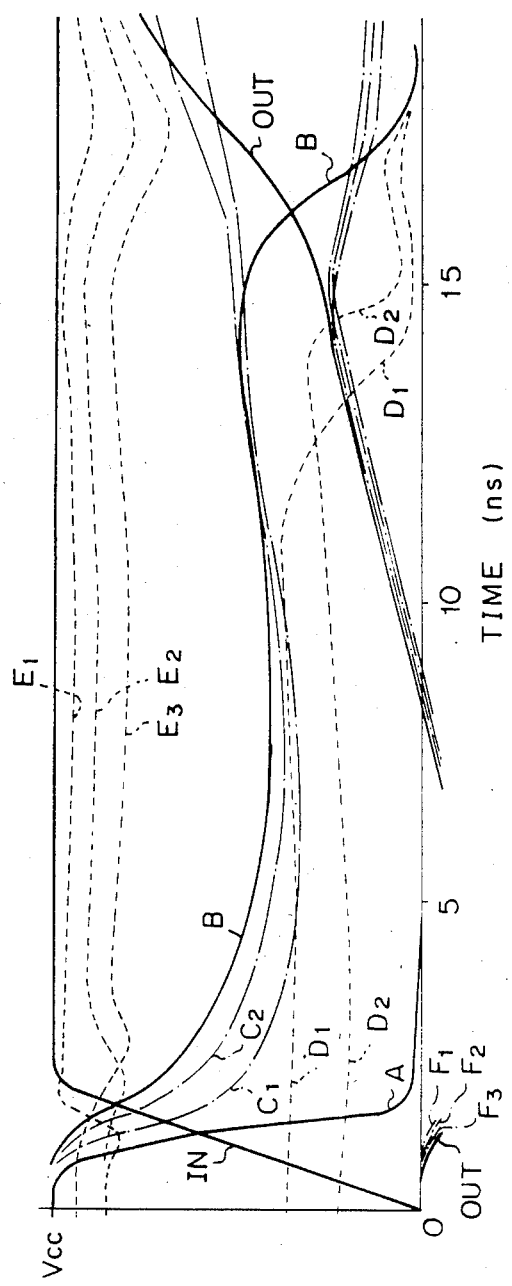

Note that the reason why the delay time period in FIG. 27 is larger than that in FIG. 28 is that the driving power for P-channel transistors is smaller than that for N-channel transistors.

Thus, when the potential at the input terminal IN is changed from low to high, the delay time period is larger than 17 ns, while when the potential at the input terminal IN is changed from high to low, the delay time is larger than 7 ns. In any case, a delay time period having a time larger than 5 ns can be obtained and therefore, is larger than that of FIG. 5.

FIGS. 27 and 28 show the case where the fan-out is 0. However, if the fan-out is larger than 1, the delay time period is further increased.

As explained hereinbefore, according to the present invention, the delay time period can be increased as compared with the prior art where a plurality of inverters are simply connected in series. In other words, with the same delay time period, it is possible to reduce the area occupied by the delay circuit.

We claim:

1. A delay circuit comprising:
   an input terminal (IN);
   an intermediate terminal (C);
   an output terminal (OUT);
   first and second power supply means ($V_{cc}$, GND);
   a first inverter (INVA) connected between said input terminal and said intermediate terminal, said first inverter comprising:
      a plurality of first P-channel transistors ($Q_{1p}$ to $Q_{4p}$) connected in series between said first power supply means and said intermediate terminal, said first P-channel transistors being driven by the potential at said input terminal;
      a plurality of first N-channel transistors ($Q_{1n}$ to $Q_{4n}$) connected in series between said intermediate terminal and said second power supply terminal, said first N-channel transistors being driven by the potential at said input terminal; and
   a second inverter (INVB) connected between said intermediate terminal and said output terminal, said second inverter comprising:
      a plurality of second P-channel transistors to ($Q_{1p}'$ to $Q_{4p}'$) connected in series between said first power supply means and said output terminal, said second P-channel transistors being driven by the potential at said intermediate terminal, and
      a plurality of second N-channel transistors ($Q_{1n}'$ to $Q_{4n}'$) connected in series between said output terminal and said second power supply terminal, said second N-channel transistors being driven by the potential at said intermediate terminal.

2. A circuit as set forth in claim 1, further comprising:
   a third inverter (INVA') connected between said first and second inverters, said third inverter comprising a pair of P-channel/N-channel transistors connected in series, and a fourth inverter (INVB') connected to the output of said second inverter, said fourth inverter comprising a pair of P-channel/N-channel transistors connected in series.

3. A delay circuit comprising:
an input terminal (IN);
an output terminal (OUT);
first and second power supply means ($V_{cc}$, GND); and first and second inverters (INVA, INVB) connected in series between said input terminal and said output terminal, each of said first and second inverters having the same number of P-channel transistors and N-channel transistors connected in series between said first and second power supply terminals;

the common outputs of some of the pairs of P-channel/N-channel transistors of said second inverter being fed back to the inputs of the pairs of P-channel/N-channel transistors of said first inverter.

4. A delay circuit comprising:
an input terminal (IN);
an output terminal (OUT);
first and second power supply means ($V_{cc}$, GND); and first and second inverters (INVA, INVB) each having the same number of P-channel transistors and N-channel transistors connected in series between said first and second power supply means;

the outermost pair of P-channel/N-channel transistors of said first inverter being driven by the potential at said input terminal;

the pairs of P-channel/N-channel transistors of said second inverter being sequentially driven from the outside to the inside by each common output of the pairs of P-channel/N-channel transistors of said first inverter;

the pairs of P-channel/N-channel transistors of said first inverter, except for the outermost pair, being sequentially driven by each common output of the pairs of P-channel/N-channel transistors of said second inverter;

the common output of the innermost pair of P-channel/N-channel transistors of said second inverter being connected to said output terminal.

5. A delay circuit comprising:
an input terminal (IN);
an output terminal (OUT);
first and second power supply means ($V_{cc}$, GND); and first and second inverters (INVA, INVB) each having the same number of P-channel transistors and N-channel transistors connected in series between said first and second power supply means;

the outermost pair of P-channel/N-channel transistors of said first inverter being driven by the potential at said input terminal;

the outermost pair of P-channel/N-channel transistors of said second inverter being driven by the common output of the outermost pair of P-channel/N-channel transistors of said first inverter;

the inside pairs of P-channel/N-channel transistors of said first inverter being driven by the common output of the outermost pair of P-channel/N-channel transistors of said second inverter;

the inside pairs of P-channel/N-channel transistors of said second inverter being driven by the common output of the innermost pair of P-channel/N-channel transistors of said first inverter;

the output of the innermost pair of P-channel/N-channel transistors of said second inverter being connected to said output terminal.

6. A delay circuit comprising:
an input terminal (IN);
an output terminal (OUT);
first and second power supply means ($V_{cc}$, GND); and first and second inverters (INVA, INVB) each having the same number of P-channel transistors and N-channel transistors connected in series between said first and second power supply means;

the outermost pair of P-channel/N-channel transistors of said first inverter being driven by the potential at said input terminal;

the outermost pair of P-channel/N-channel transistors of said second inverter being driven by the common output of the outermost pair of P-channel/N-channel transistors of said first inverter;

the inside pairs of P-channel/N-channel transistors of said first inverter being driven by the common output of the innermost pair of P-channel/N-channel transistors of said second inverter;

the inside pairs of P-channel/N-channel transistors of said second inverter being driven by the common output of the innermost pair of P-channel/N-channel transistors of said first inverter;

the output of the innermost pair of P-channel/N-channel transistors of said second inverter being connected to said output terminal.

* * * * *